United States Patent
Lu et al.

(10) Patent No.: US 7,741,169 B2
(45) Date of Patent: Jun. 22, 2010

(54) MOBILITY ENHANCEMENT BY STRAINED CHANNEL CMOSFET WITH SINGLE WORKFUNCTION METAL-GATE AND FABRICATION METHOD THEREOF

(75) Inventors: Shin-Chii Lu, Hsinchu (TW); Yu-Ming Lin, Tainan County (TW); Min-Hung Lee, Taipei County (TW); Zing-Way Pei, Taichung (TW); Wen Yi Hsieh, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 156 days.

(21) Appl. No.: 12/185,740

(22) Filed: Aug. 4, 2008

(65) Prior Publication Data

US 2008/0311713 A1  Dec. 18, 2008

Related U.S. Application Data

(62) Division of application No. 11/324,085, filed on Dec. 29, 2005, now abandoned.

(30) Foreign Application Priority Data

Sep. 23, 2005  (TW) ............... 94133084 A

(51) Int. Cl.
*H01L 21/8238* (2006.01)
*H01L 21/8234* (2006.01)

(52) U.S. Cl. ............... 438/199; 438/275; 257/E21.632
(58) Field of Classification Search ............... 438/199, 438/275; 257/E21.632
See application file for complete search history.

(56) References Cited

U.S. PATENT DOCUMENTS

| 6,784,507 B2 * | 8/2004 | Wallace et al. ............... 257/410 |
| 6,927,414 B2 * | 8/2005 | Ouyang et al. ............... 257/20 |
| 2003/0062586 A1 * | 4/2003 | Wallace et al. ............... 257/506 |
| 2006/0160290 A1 * | 7/2006 | Chong et al. ............... 438/199 |

FOREIGN PATENT DOCUMENTS

| JP | 2003-086708 | 3/2003 |
| JP | 2003-332462 A | 11/2003 |
| JP | 2004-221114 A | 8/2004 |
| JP | 2004-235345 | 8/2004 |

* cited by examiner

*Primary Examiner*—Luan C Thai
(74) *Attorney, Agent, or Firm*—Quintero Law Office

(57) ABSTRACT

The present invention provides a complementary metal-oxide-semiconductor (CMOS) device and a fabrication method thereof. The CMOSFET device includes a compressively strained SiGe channel for a PMOSFET, as well as a tensile strained Si channel for an NMOSFET, thereby enhancing hole and electron mobility for the PMOSFET and the NMOSFET, respectively. As such, the threshold voltages of the two types of transistors can be obtained in oppositely symmetric by single metal gate.

5 Claims, 4 Drawing Sheets

MOBILITY ENHANCEMENT BY STRAINED CHANNEL CMOSFET WITH SINGLE WORKFUNCTION METAL-GATE AND FABRICATION METHOD THEREOF

This application is a divisional of U.S. application Ser. No. 11/324,085, filed Dec. 29, 2005, the entire disclosure of which is hereby incorporated by reference.

BACKGROUND OF THE INVENTION

1. Field of the Invention

The present invention relates to complementary metal-oxide-semiconductor (CMOS) technology. More particularly, it relates to combining a compressively strained SiGe channel of a PMOSFET with a local tensile strained Si channel of an NMOSFET, such that a band gap narrowing of the CMOSFET and improving holes and electrons mobility of the PMOSFET and NMOSFET, respectively.

2. Description of the Related Art

The density of integrated circuits (IC) continues to increase and feature size thereof continues to scale down, improving the performance of IC devices and lowering manufacturing costs. Shorter channel length causes gate electrodes to lose channel controllability due to the short channel effect (SCE). This controllability problem can be solved by reducing the thickness of the gate dielectric layer (silicon dioxide), and this decreases the operating voltage and increases driving current. As a result, the leakage current is significantly increased with a direct tunneling effect, and the controllability issue still exists.

The physical thickness of high-k materials is much thicker than that of silicon dioxide under the same capacitance. With high-k materials serving as a gate dielectric layer, the electric filed in dielectric is lower under a same bias voltage, thereby decreasing the current leakage. High-k gate dielectrics are therefore considered to be a promising solution for replacing conventional silicon dioxide.

Semiconductor technology includes high-temperature processes, such as activation annealing after ion implantations. In the conventional art, poly-Si has been widely used as gate material due to its thermal budget and interface properties with silicon dioxide. When IC dimensions decrease, the poly-Si has issues of poly depletion and sheet resistance. In deep submicron CMOSFET technology, introduction of metal-gates has become a mainstream method for reducing the described problems.

To design a high speed CMOSFET with lower power loss, threshold voltages of PMOSFET and NMOSFET have to be oppositely symmetric. To obtain a tunable work function of metal gate in a CMOS, dual metal-gate electrodes or ion implantation to tune work function is applied. The former, however, is a complex process, and the latter is limited by solid solubility.

A method for reducing the channel effective band gap in a single workfunction metal gate, band gap offset of strained Si and strained SiGe channels are disclosed in IEEE EDL, vol. 25-6, pp. 402-404, entitled "Strained-Si-Strained-SiGe Dual-Channel Layer Structure as CMOS Substrate for Single Workfunction Metal-gate Technology", published in June 2004. In this method, a compressively strained $Si_{0.4}Ge_{0.6}$ layer as a hole channel and a tensile strained Si layer as an electron channel are formed sequentially on a $Si_{0.7}Ge_{0.3}$ virtual substrate, wherein the Si layer of a PMOSFET is thicker than that of the NMOSFET to make sure that the reversion channel in the compressively strained SiGe layer. As shown in FIG. 1, tensile strained Si (region I), compressively strained $Si_{0.4}Ge_{0.6}$ (region II), relaxed $Si_{0.7}Ge_{0.3}$ buffer (region III), and bulk Si (region IV) are used as channels with different energy gaps. The tensile strained Si enhances electron mobility significantly in NMOSFET. However, the tensile strained Si cannot significantly improve the hole mobility in PMOSFET. Using compressively strained $Si_{0.4}Ge_{0.6}$ as a hole channel can enhance the operational speed of the PMOSFET. Therefore, the cited paper applies the $Si_{0.4}Ge_{0.6}$ and the tensile-strained Si as channels of the PMOSFET and the NMOSFET, respectively, such that the effective band gap is narrower than the bulk Si by 0.5 eV (from 1.1 eV to 0.6 eV). An ideal oppositely symmetrical threshold voltage of the PMOSFET and the NMOSFET can be obtained by a single metal-gate of 4.5 eV workfunction. This method requires a SiGe virtual substrate that leads increasing costs and the thickness of the ultra-thin Si cap layer overlying the PMOSFET is difficult to control.

Presently strained channel engineering mainly comprises global strain and local strain. Disadvantages of the global strain include high cost, low hole mobility, and high defect density in the SiGe virtue substrate. The disadvantage of the local strain is difficult in process control.

U.S. Pat. No. 6,784,507 discloses a structure of CMOSFET and BiCMOSFET, which includes a PMOSFET having a compressively strained SiGe channel, and an NMOSFET having a Si channel. A compressively strained SiGe channel is used for enhancing the hole mobility of the PMOSFET, but the electron mobility of the NMOSFET is not improved.

An improvement of mobility enhancement by strained channel CMOSFET with single workfunction metal-gate and a fabrication method is called for.

BRIEF SUMMARY OF INVENTION

According to the invention, a method and a device for mobility enhancement by strained channel CMOSFET with single workfunction metal-gate are provided; wherein a PMOSFET channel is compressively strained for improving hole mobility, and an NMOSFET channel is tensile strain for enhancing electron mobility.

An exemplary embodiment of the present invention uses a compressively strained channel, for narrowing the band gap.

The method for fabricating a mobility enhancement by strained channel CMOSFET with single workfunction metal gate of the invention comprises: providing a semiconductor substrate is formed with regions of a PMOSFET and an NMOSFET. A compressively strained film is formed overlying the PMOSFET channel, and then gate dielectric layers are formed on the NMOSFET region and the compressively strained film, respectively. Gate electrodes are formed on the gate dielectric layers, and a cap layer is then formed overlying the NMOSFET region for producing a local tensile stress on a channel of the NMOSFET.

The mobility enhancement by strained channel CMOSFET, comprising a semiconductor substrate with an isolation region for defining regions of a PMOSFET and an NMOSFET. A compressively strained film is overlying the PMOSFET region as a channel of the PMOSFET. A gate dielectric layer is on the NMOSFET region and the compressively strained film, respectively. Gate electrodes are on the gate dielectric layers. A cap layer is overlying the NMOSFET region for producing a local tensile stress on a channel of the NMOSFET.

The present invention combines a PMOSFET compressively strained channel and an NMOSFET tensile strained channel. The compressively strained channel enhances the PMOSFET hole mobility, and the tensile stress enhances the NMOSFET electron mobility.

The single workfunction metal gate of the invention is not only used alone but also with high-k materials.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

A mobility enhancement by strained channel CMOSFET with single workfunction metal gate will be described here in greater detail. Some embodiments of the invention, such as the exemplary embodiments described can potentially improve the hole and electron mobility of the PMOSFET and the NMOSFET, respectively. The single workfunction metal gate is further combined with high-k materials. In some embodiments, this can be accomplished by forming a compressively strained SiGe channel in the PMOSFET region, and a tensile cap layer in the NMOSFET region to produce a local tensile stress on the NMOSFET channel.

Figure 1:
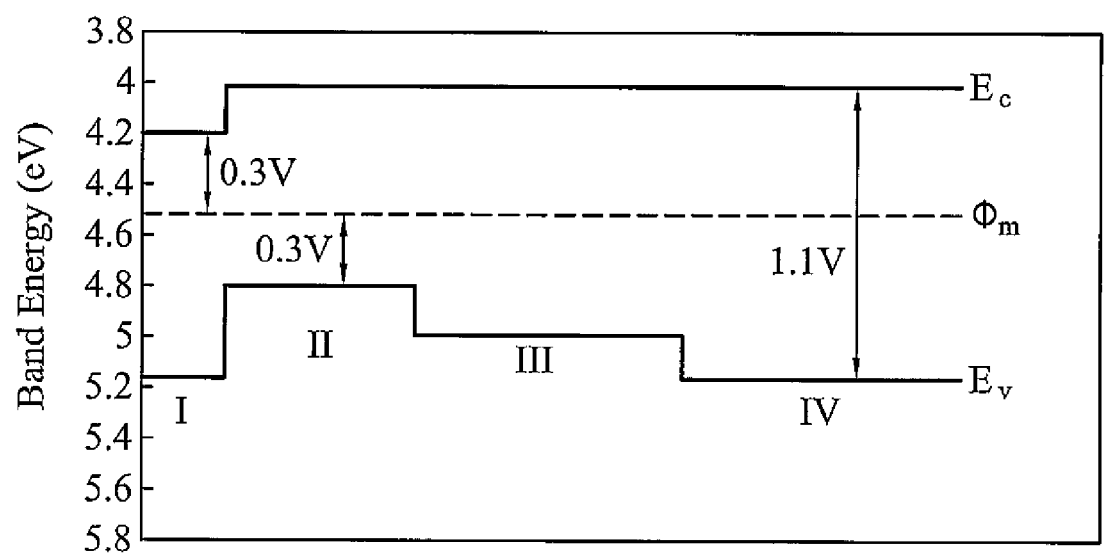
FIG. 1 is a schematic diagram showing the band diagram of tensile strained Si, compressively strained $Si_{0.4}Ge_{0.6}$, relaxed $Si_{0.7}Ge_{0.3}$ buffer, and bulk Si.
Figure 2A:
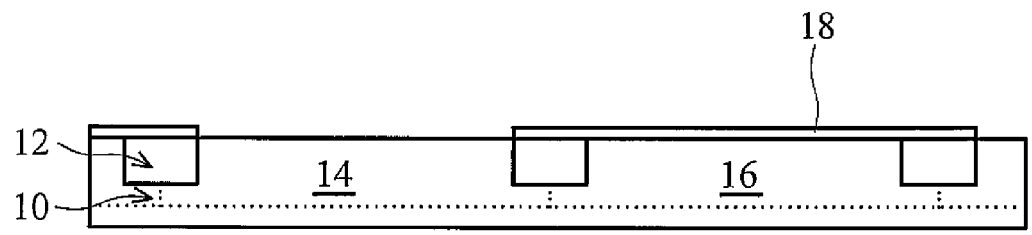
FIG. 2A-2E are cross sections of semiconductor structures that illustrate processing required to fabricate a mobility enhancement by strained channel CMOSFET with single workfunction metal gate.

Referring now to the drawings, FIG. 2A is a schematic diagram of an embodiment of the CMOSFET of the present invention. As shown in FIG. 2A, a semiconductor substrate 10, preferably a Si substrate is provided. The semiconductor substrate 10 has isolation regions 12 (shallow trench isolation, STI) to define the PMOSFET region 14 and the NMOSFET region 16. The PMOSFET region 14 and the NMOSFET region 16 can be doped to be a n-type well and a p-type well, respectively. An amorphous layer is formed overlying the substrate 10 and the isolation region 12, preferably a pad oxide. The amorphous layer on the NMOSFET region remains as an amorphous layer 18, and the amorphous layer on the PMOSFET is removed to expose the PMOSFET region 14.

Figure 2B:
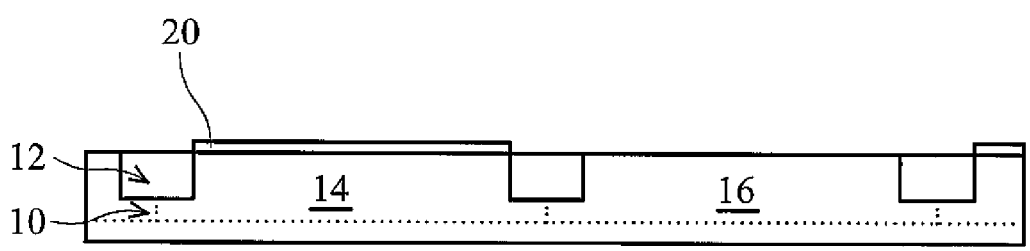

As shown in FIG. 2B, a compressively strained film 20 is then formed on the PMOSFET region 14. In preferred embodiment of the present invention, the amorphous layer 18 can be used as a mask to form the compressively strained film 20 by selective epitaxy. The selective epitaxy means a film is selectively grown on a surface with a specific morphology. In this preferred embodiment, the semiconductor substrate of the PMOSFET region 14 has an lattice surface morphology, while that of the NMOSFET region 16 is an amorphous layer 18. Accordingly, the selective epitaxy occurs only on the PMOSFET region 14, but poly or amorphous film of poor quality may sometimes grow on the amorphous layer 18.

In preferred embodiment of the present invention, the methods for forming the compressively strained film 20 comprise forming a SiGe film by plasma enhanced chemical vapor deposition (PECVD), ultra high vacuum chemical vapor deposition (UHV/CVD), rapid thermal chemical vapor deposition (RTCVD), or molecular beam epitaxy (MBE).

Compressive stress of the SiGe film on the Si substrate relates to its Ge concentration. Increasing the Ge concentration of the SiGe film will enhance the hole mobility of the PMOSFET. When the Ge concentration is higher, the critical thickness of the SiGe film is thinner. If a thickness of the SiGe film is thicker than the critical thickness, the SiGe will become relaxed and defects will occur. On the other hand, if the thickness of the SiGe film is too thin, the holes will transport in the Si substrate without enhancement by the compressively strained film. In a preferred embodiment of the present invention, the SiGe film has a Ge concentration from 0.1% to 100% with a thickness from 1 nm to 500 nm. The preferred thickness is thinner than the critical thickness to avoid the film being relaxed and defects.

The amorphous layer 18 and the poly or amorphous film of poor quality (if any) on the NMOSFET region 16 are then removed. Only the SiGe film 20 on the PMOSFET region 14 is retained.

Figure 2C:
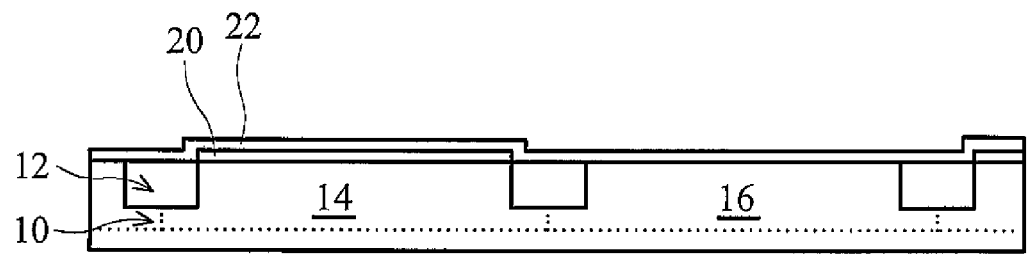

As shown in FIG. 2C, a gate dielectric layer is then deposited on both the NMOSFET region 16 and the compressively strained film 20. A conventional method of forming a gate dielectric layer on the Si substrate is thermal oxidation, but this is not suitable for SiGe films. The preferred method for forming the gate dielectric layer in the present invention is deposition, preferably of high-k materials such as $ZrO_2$, $HfO_2$, $TiO_2$, $Ta_2O_5$, $Al_2O_3$, $La_2O_3$, SiON, or other materials having a dielectric constant higher than that of $SiO_2$.

Figure 2D:
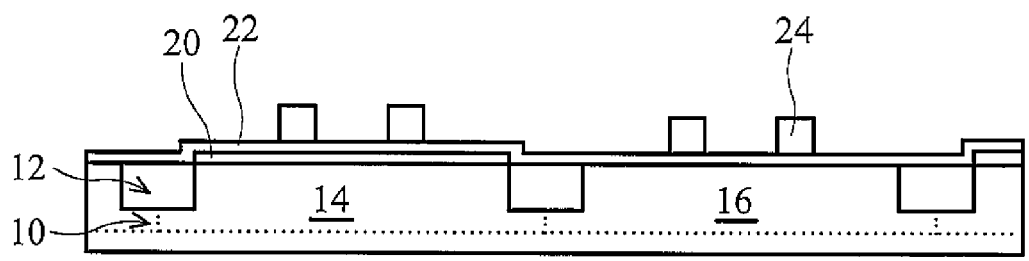

As shown in FIG. 2D, the gate electrode layer is deposited on the gate dielectric layer. The gate electrode layer may comprise conventional materials such as poly-Si, poly-SiGe; materials having a Fermi level corresponding to the mid-gap of the semiconductor substrate such as TiN, Ti, TaN, Ta, W; or other materials have a suitable workfunction. TiN is suitable for use as gate electrodes due to its adhesion, matured manufacturing process, and thermal stability. Sometimes a W or Al layer may be provided on the TiN gate electrode to reduce resistance.

As shown in FIG. 2D, the gate electrode layer is patterned by lithography and anisotropic etching for forming gate electrodes 24. In a preferred embodiment of the present invention, the gate electrodes are formed in ring-FET structure as a close-loop. The close-loop comprises circle, rectangle, or other suitable shapes. The drain and source of the ring-FET are separated by the close-loop, such that current leakage can be reduced efficiently.

Figure 2E:
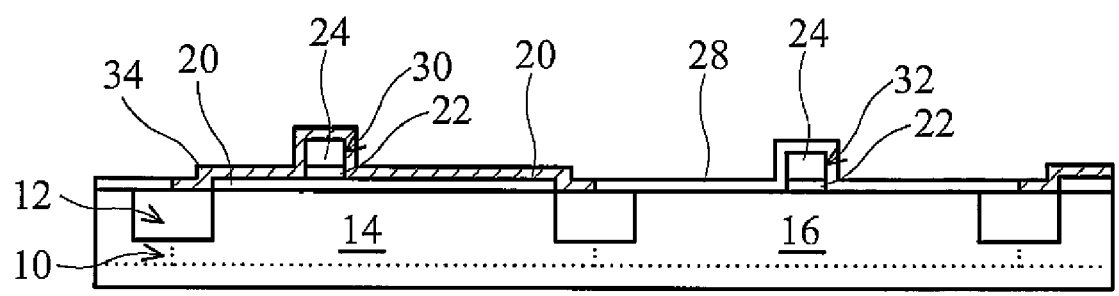

It should be noted that the present invention is not limited to the above ring-FET structure, but can be a conventional FET structure as shown in FIG. 2E. The gate dielectric layer not masked by the gate electrodes is removed by anisotropic etching.

As shown in FIG. 2E, a cap layer is formed overlying the NMOSFET region and the PMOSFET region to produce a tensile stress on a channel of the NMOSFET. In a preferred embodiment of the present invention, the cap layer comprises, but is not limited to nitride as SiN. The cap layer has a thickness from 1 nm to 1 μm. According to the present invention, those skilled in the art can choose other suitable materials for producing a tensile stress on the channel of the NMOSFET.

In addition, Ge ions may be doped to the cap layer 28 to form a dopped Ge cap layer 34 so as to prevent the compressively strained SiGe channel 20 of the PMOSFET region from being affected by the tensile strain of the cap layer 28.

Furthermore, the cap layer 34 on the PMOSFET region can be selectively removed by lithography and etching, leaving the cap layer 34 on the NMOSFET region to produce tensile stress only on the NMOSFET channel.

While the invention has been described by way of examples and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a complementary MOSFET consisting of a PMOSFET and an NMOSFET, comprising:
   providing a semiconductor substrate with regions of a PMOSFET and an NMOSFET;
   forming a compressively strained film overlying the PMOSFET channel;
   forming gate dielectric layers on the NMOSFET region and the compressively strained film, respectively;
   forming gate electrodes on the gate dielectric layers; and
   forming a cap layer overlying the NMOSFET region for producing a local tensile stress on a channel of the NMOSFET;
   wherein formation of the compressively strained film overlying the PMOSFET region comprises:
      forming an amorphous layer overlying the semiconductor substrate, including the PMOSFET and the NMOSFET regions;
      removing the amorphous layer overlying the PMOSFET region; and
      forming the compressively strained film overlying the PMOSFET region by selective epitaxy.

2. The method as claimed in claim 1, further comprising removing the amorphous layer overlying the NMOSFET.

3. The method as claimed in claim 1, wherein the amorphous layer comprises an oxide layer.

4. The method as claimed in claim 1, wherein the cap layer is further formed overlying the PMOSFET region, and further doped with Ge ions at positions overlying the PMOSFET, such that the channel of the PMOSFET is substantially free of a tensile stress.

5. The method as claimed in claim 1, wherein the cap layer is further formed overlying the PMOSFET region, and the method further comprises removing the cap layer formed overlying the PMOSFET region.

* * * * *